United States Patent [19]
Mahoney et al.

[11] Patent Number: 6,133,335
[45] Date of Patent: *Oct. 17, 2000

[54] PHOTO-POLYMERIZABLE COMPOSITIONS AND ARTICLES MADE THEREFROM

[75] Inventors: Wayne S. Mahoney, St. Paul; Peggy S. Willett; Michael A. Johnson, both of Stillwater, all of Minn.

[73] Assignee: 3M Innovative Properties Company, St. Paul, Minn.

[*] Notice: This patent is subject to a terminal disclaimer.

[21] Appl. No.: 09/224,421

[22] Filed: Dec. 31, 1998

[51] Int. Cl.$^7$ .............................. C08K 5/13; C08L 63/00; C08L 67/02; C08J 3/28

[52] U.S. Cl. ................................ 522/29; 522/27; 522/28; 522/66; 522/146; 522/170; 522/179; 528/92; 528/219; 528/280; 528/297; 528/421

[58] Field of Search ................................ 522/17, 18, 22, 522/27, 28, 29, 129, 146, 170, 179, 66; 528/92, 219, 421, 280, 297

[56] References Cited

U.S. PATENT DOCUMENTS

| | | | |
|---|---|---|---|
| 3,907,706 | 9/1975 | Robins | 252/431 |
| 4,297,458 | 10/1981 | Stark, Jr. | 525/507 |
| 4,503,211 | 3/1985 | Robins | 528/92 |
| 4,677,137 | 6/1987 | Bany et al. | 522/31 |
| 4,788,235 | 11/1988 | Johnson | 523/451 |
| 4,868,288 | 9/1989 | Meier | 534/15 |
| 5,059,701 | 10/1991 | Keipert | 556/13 |
| 5,073,476 | 12/1991 | Meier et al. | 430/280 |
| 5,089,536 | 2/1992 | Palazzotto | 522/16 |
| 5,191,101 | 3/1993 | Palazzotto et al. | 556/47 |
| 5,212,210 | 5/1993 | Halm | 522/24 |
| 5,252,694 | 10/1993 | Willett et al. | 525/404 |
| 5,310,840 | 5/1994 | Willett et al. | 526/273 |
| 5,362,421 | 11/1994 | Kropp et al. | 252/512 |
| 5,371,115 | 12/1994 | Meier et al. | 522/13 |
| 5,385,954 | 1/1995 | Palazzotto et al. | |
| 5,494,943 | 2/1996 | Mahoney et al. | 522/66 |
| 5,494,944 | 2/1996 | Meier et al. | 522/18 |
| 5,521,227 | 5/1996 | Palazzotto et al. | |
| 5,554,664 | 9/1996 | Lamanna et al. | 522/25 |
| 5,672,637 | 9/1997 | Mahoney et al. | 522/25 |

FOREIGN PATENT DOCUMENTS

| | | |
|---|---|---|
| 094914 | 5/1983 | European Pat. Off. . |
| 0 152 377 | 2/1985 | European Pat. Off. . |
| 0 340 591 | 4/1989 | European Pat. Off. . |
| 661324 | 11/1994 | European Pat. Off. . |
| 0 764 690 | 6/1996 | European Pat. Off. . |
| 61-36302 | 2/1986 | Japan . |
| 9-325479 | 12/1997 | Japan . |
| 93 15124 | 8/1993 | WIPO . |
| 96 21704 | 7/1996 | WIPO . |
| 96 32453 | 10/1996 | WIPO . |

OTHER PUBLICATIONS

Chemical Abstracts, vol. 88, No. 22, May 29, 1978, Columbus, Ohio, US; abstract No. 153433, Markowitz, Mark: "Controllable reactivity epoxy resin hardeners" XP 002114532 abstract & Proc. Acs. Symp., 1977, pp. 49–58.
McAdams et al, "Epoxy Resins", Encyclopedia of Polymer Science and Engineering, vol. 6, 1986, p. 322–382.
Wrighton et al, "Preparation of Chemically Derivatized Platinum and Gold Electrode Surfaces, Synthesis, Characterization, and Surface Attachment of Trichlorosilylferrocene", Journal of the American Chemical Society, vol. 100, No. 23 Nov. 8, 1978, p. 7264–7271.
Hendrickson, D. N., Sohn, Y. S., Gray, H. B., "Magnetic Susceptibility Study of Various Ferricenium and Iron (III) Dicarbollide Compounds", Inorganic Chemistry, vol. 10, No. 8, Aug. 1971, p. 1559–1563.
F. A. Cotton, G. Wilkinson, Periodic Table of Elements, Basic Inorganic Chemistry, John Wiley & Sons, Inc., 1976, p. 497–527.
C. R. Noller, Chemistry of Organic Compounds, $3^{rd}$ Edition, 1996, p. 602.

*Primary Examiner*—Susan W. Berman
*Attorney, Agent, or Firm*—Brian E. Szymanski

[57] ABSTRACT

The present invention provides compositions comprising epoxy-containing monomers, where the polymerization of the monomers can be influenced by accelerators. The compositions include at least one photo-polymerizable epoxy monomer and an initiation system. The initiation system comprises at least one organo-iron complex salt and at least one accelerator. The epoxy-containing monomers are energy-polymerized to form useful articles or coated articles.

12 Claims, 1 Drawing Sheet

PHOTO-POLYMERIZABLE COMPOSITIONS AND ARTICLES MADE THEREFROM

FIELD OF INVENTION

The present invention relates to photo-polymerizable compositions comprising a cationically curable epoxy-containing monomer and a two-component initiator, more particularly, to such a composition comprising a two-component initiator which includes at least one salt of an organo-iron complex cation and at least one accelerator, and even more particularly to such a composition comprising an accelerator which, upon photo-activation, enables a color change in the epoxy-containing composition. The invention also relates to articles prepared using the noted composition.

BACKGROUND

Epoxy based compositions have been utilized in various applications, including the making of articles for use on motor vehicles. For example, these thermoset polymers are suitable for use in applications such as sealants, adhesives, moldings, and decorative features. Depending upon the application, such compositions have typically been either formed and cured prior to application on the vehicle or applied onto the vehicle and cured in place. Alternatively, some epoxy based compositions have been only partially cured prior to application on the vehicle and then additionally cured after being applied. The partially cured state of the epoxy composition provides dimensional stability to an article made with the composition and thus helps the article retain its shape during subsequent processing. The use of thermoset epoxy based compositions on motor vehicles often requires the curing of the epoxy under strict manufacturing timing constraints.

It is desirable for vehicle related articles produced from epoxy based compositions to match the color of other portions of the vehicle and, thereby, provide a desirable aesthetic appearance to the vehicle. The vehicle related articles produced from epoxy based compounds may be painted to match the color of other portions of the vehicle. Additionally, other epoxy based compositions that will not be painted may also require certain colors to match surrounding vehicle parts or to disguise the use of the epoxy based composition. The epoxy compositions do not always result in a desirable color upon polymerization.

It has typically been difficult for the epoxy portion of such articles to be painted "on-line" along with the rest of the vehicle because the paint is often brittle and tends to crack and flake off the surface of the epoxy portion of the article. This is particularly true with the electrostatically applied paint typically used in the automotive industry. In response to this problem, such articles have been painted "off-line" in a separate operation using specially formulated paints. The "off-line" application of a finished color coat does not always result in an adequate color match. Additionally, the portions of the vehicle to be painted are first primed with a base coat prior to the application of a finished color coat. The entire vehicle is then painted. Under these circumstances, if the color of the article does not closely match that of the primer, the painted article may appear different from that of the primed portions of the vehicle.

Alternatively, epoxy based compositions have been formulated with pigments to provide color matching with other portions of the vehicle. The utilization of pigments, however, can also result in an undesirable aesthetic difference between the article and the other portions of the vehicle. Additionally, the use of pigments in photo-polymerizable epoxy compositions may inhibit photo-polymerization.

Thus, it is desirable to provide an accelerator in an epoxy based composition in order to improve the curing time of the composition. Additionally, it is desirable to provide or impart specific colors to the cured, or partially cured, composition to achieve a desirable aesthetic appearance without adversely affecting the polymerization of the epoxy compositions.

SUMMARY OF THE INVENTION

The present invention relates to compositions comprising photo-polymerizable epoxy-containing monomers, where the polymerization of the monomers can be influenced by accelerators. The epoxy-containing monomers are energy-polymerized to form useful articles or coated articles. Preferably, the compositions are photo-polymerizable to achieve advantageous effects. In particular, the compositions of this invention, preferably, exhibit reduced time for polymerization while permitting an advantageous color change in the composition upon photo-activation.

Briefly, in one aspect, this invention provides a photo-polymerizable composition. The composition includes at least one photo-polymerizable epoxy-containing monomer and a two component initiator. The two component initiator includes at least one salt of an organo-iron complex cation and at least one accelerator. The composition can optionally include at least one of an alcohol-containing material and additional adjuvants, such as stabilizing ligands, thermoplastic resins, and coupling agents.

The inclusion of the accelerator of the present invention imparts a desirable color upon the polymerized epoxy composition. The color change is recorded as a change from an initial color at an un-polymerized state to a color measured in a polymerized state. The color change, as indicated by HunterLab color scale coordinates is indicated by an L value of 5 or more, and preferably, 15 or more.

In a further aspect, the invention provides a process for controlling or modifying the cure of a composition providing the polymerizable composition of the invention as previously described above. The composition is then subjected to a sufficient amount of energy, in the form of at least actinic energy, in order to polymerize the composition.

In yet a further aspect, this invention provides an article comprising a substrate having on at least one surface thereof a layer of the composition of the invention. The article is produced by providing a substrate, coating the substrate with the curable composition of the invention, and supplying sufficient energy to the composition in the form of at least actinic energy to polymerize the composition.

For purposes of the present invention, the following terms used in this application are defined as follows:

"energy polymerization" means curing or polymerization by means of thermal (infrared and heat) or actinic energy (ultraviolet, visible, or electron beam), or combinations thereof;

"photo-activation" means application of sufficient actinic energy to initiate the polymerization or cure;

"catalytically-effective amount" means a quantity sufficient to effect polymerization of the curable composition to a polymerized product at least to a degree to cause an increase in viscosity of the composition under the conditions specified;

"initiator" and "catalyst" are used interchangeably and mean at least one salt of an organo-iron complex cation that can change the speed of a chemical reaction;

"catonically curable monomer" means at least one epoxide containing material;

"polymerizable composition" or "curable composition" as used herein means a mixture of the initiator system and the cationically curable monomer; alcohols and adjuvants optionally can be present;

"polymerize" or "cure" means to supply sufficient energy to a composition in the form of at least actinic energy to alter the physical state of the composition, to make it transform from a fluid to less fluid state, to go from a tacky to a non-tacky state, to go from a soluble to insoluble state, or to decrease the amount of polymerizable material by its consumption in a chemical reaction;

"photo-polymerize" means to polymerize through the application of at least actinic energy;

"B-staged" refers to an intermediate state in a thermosetting resin reaction in which the material softens when heated and swells, but does not dissolve in certain liquids, as described in ASTM Standard D907-91b, the material is partially cured (cross-linked) and dimensionally stable;

"initiation system", "initiator system", or "two-component initiator" means at least one salt of an organo-iron complex cation and at least one accelerator, the system being capable of initiating polymerization;

"accelerator" means at least one of a specified class of compounds that moderate the cure of a composition of the invention;

"epoxy-containing" means a material comprising at least one epoxy and may further comprise accelerating additives, stabilizing additives, fillers, diols, and other additives;

"group" or "compound" or "ligand" means a chemical species that allows for substitution or which may be substituted by conventional substituents which do not interfere with the desired product, e.g., substituents can be alkyl, alkoxy, aryl, phenyl, halo (F, Cl, Br, I), cyano, nitro, etc., and An advantage of at least one of the embodiments of the present invention is the use of an initiator system that can impart a color change to the composition upon photo-polymerization Another advantage of at least one of the embodiments of the invention is that the initiator system can provide enhanced curing of a photo-polymerizable composition.

BRIEF DESCRIPTION OF FIGURES

The invention will be more fully appreciated with reference to the following drawings in which similar reference numerals designate like or analogous components throughout and in which.

DETAILED DISCLOSURE

Figure 1:
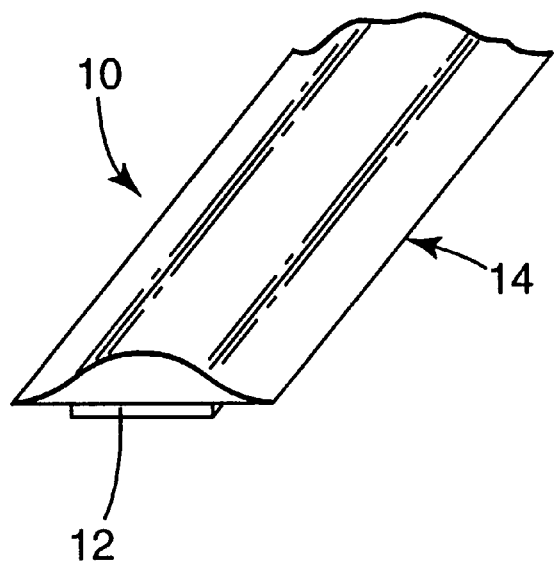
FIG. 1 is a partial perspective view of one embodiment of an article according to the invention.

The present invention provides an energy polymerizable composition comprising at least one cationically-polymerizable epoxy containing material and two component initiation system. The initiation system includes at least one organo-iron complex salt and at least one accelerator. The cured composition provides useful articles or coated articles.

The composition of the present invention utilizes at least one epoxy-containing compound. The epoxy compound is generally a photo-polymerizable epoxy-containing monomer that is either mono-functional or multi-functional. The thermosettable epoxy compounds can be cured or polymerized by cationic polymerization. The epoxy-containing monomer can also contain other epoxies compounds or blends of epoxy containing monomers with thermoplastic materials. The epoxy-containing monomer may be blended with specific materials to enhance the end use or application of the cured, or partially cured, composition. For example, the composition of the present invention can be utilized for certain articles where it would benefit the application to have the composition in a B-staged state, or partially cured, prior to end use application.

Useful epoxy-containing materials are epoxy resins having at least one oxirane ring polymerizable by a ring opening reaction. Such materials, broadly called epoxides, include both monomeric and polymeric epoxides and can be aliphatic, cycloaliphatic, or aromatic. These materials generally have, on the average, at least two epoxy groups per molecule (preferably more than two epoxy groups per molecule). The "average" number of epoxy groups per molecule is defined as the number of epoxy groups in the epoxy-containing material divided by the total number of epoxy molecules present. The polymeric epoxides include linear polymers having terminal epoxy groups (e.g., a diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer). The molecular weight of the epoxy-containing material may vary from 58 to about 100,000 or more. Mixtures of various epoxy-containing materials can also be used.

Useful epoxy-containing materials include those which contain cyclohexene oxide groups such as the epoxycyclohexanecarboxylates, typified by 3,4-epoxycyclohexylmethyl-3,4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. For a more detailed list of useful epoxides of this nature, reference may be made to U.S. Pat. No. 3,117,099.

Optionally, the epoxy-containing monomer can be blended with one or more thermoplastic materials such as, for example, polyesters, vinyl acetates, ethyl vinyl acetates, and polycaprolactones. An example of a useful blend is an epoxy-polyester blends described in Johnson et al., "Melt-Flowable Materials and Method of Sealing Surface," filed Apr. 12, 1995 and bearing Ser. No. 08/421,055, which is assigned to the same assignee as the present application and incorporated by reference herein. These compositions are melt-flowable (and thus thermoformable) in the uncured state, but resist mass flow once they have been B-staged. They feature an epoxy-containing material blended with a semi-crystalline polyester resin. The epoxy-containing material contributes to the ultimate strength and heat resistance of the composition, while the polyester component provides conformability and pliability.

The composition of the present invention, upon polymerization, may be painted for specific end use applications. Therefore, preferred polyesters are hydroxyl-terminated polyesters that are semi-crystalline at room temperature. The hydroxyl (—OH) groups subsequently promote paint adhesion because they form covalent bonds with conventionally used paint products. Other functional groups that promote paint adhesion include —NH, —CONH, —NH$_2$, —SH, —COOH, anhydride, urethane, and oxirane groups.

A material that is "semi-crystalline" displays a crystalline melting point, as determined by differential scanning calorimetry (DSC), preferably with a maximum melting point of about 200° C. Crystallinity in a polymer is also observed as a clouding or opacifying of a sheet that had been heated to an amorphous state as it cools. When the polyester polymer is heated to a molten state and knife coated onto a liner to form a sheet, it is amorphous and the sheet is observed to be clear and fairly transparent to light. As the polymer in the sheet material cools, crystalline domains form and the crystallization is characterized by the clouding of the sheet to a translucent or opaque state. The degree of crystallinity may be varied in the polymers by mixing in any compatible combination of amorphous polymers and semi-crystalline polymers having varying degrees of crystallinity. It is generally preferred that material heated to an amorphous state be allowed sufficient time to return to its semi-crystalline state before painting so that the paint is applied to a uniformly consistent surface. The clouding of the sheet provides a convenient non-destructive method of determining that crystallization has occurred to some degree in the polymer.

The polymers may include nucleating agents to increase the rate of crystallization at a given temperature. Useful nucleating agents include microcrystalline waxes. A suitable wax is, for example, sold by Petrolite Corp. as Unilin™ 700.

The preferred polyesters are solid at room temperature. Preferred polyester materials have a number average molecular weight of about 7500 to 200,000, more preferably from about 10,000 to 50,000, and most preferably, from about 15,000 to 30,000.

Polyester components useful in the invention comprise the reaction product of dicarboxylic acids (or their diester equivalents, including anhydrides) and diols. The diacids (or diester equivalents) can be saturated aliphatic acids containing from 4 to 12 carbon atoms (including branched, unbranched, or cyclic materials having 5 to 6 carbon atoms in a ring) and/or aromatic acids containing from 8 to 15 carbon atoms. Examples of suitable aliphatic acids are succinic, glutaric, adipic, pimelic, suberic, azelaic, sebacic, 1,12-dodecanedioic, 1,4-cyclohexanedicarboxylic, 1,3-cyclopentanedicarboxylic, 2-methylsuccinic, 2-methylpentanedioic, 3-methylhexanedioic acids, and the like. Suitable aromatic acids include terephthalic acid, isophthalic acid, phthalic acid, 4,4'-benzophenone dicarboxylic acid, 4,4'-diphenylmethanedicarboxylic acid, 4,4'-diphenylthioether dicarboxylic acid, and 4,4'-diphenylamine dicarboxylic acid. Preferably the structure between the two carboxyl groups in the diacids contain only carbon and hydrogen, and more preferably, the structure is a phenylene group. Blends of the foregoing diacids may be used.

The diols include branched, unbranched, and cyclic aliphatic diols having from 2 to 12 carbon atoms. Examples of suitable diols include ethylene glycol, 1,3-propylene glycol, 1,2-propylene glycol, 1,4-butanediol, 1,3-butanediol, 1,5-pentanediol, 2-methyl-2,4-pentanediol, 1,6-hexanediol, cyclobutane-1,3-di(2'-ethanol), cyclohexane-1,4-dimethanol, 1,10-decanediol, 1,12-dodecanediol, and neopentyl glycol. Long chain diols including poly(oxyalkylene) glycols in which the alkylene group contains from 2 to 9 carbon atoms, preferably 2 to 4 carbon atoms, may also be used. Blends of the foregoing diols may be used.

Useful commercially available hydroxyl terminated polyester materials include various saturated linear, semi-crystalline copolyesters available from Creanova, Inc. such as Dynapol™ S 1401, Dynapol™ S 1402, Dynapol™ S 1358, Dynapol™ S 1359, Dynapol™ S 1227, Dynapol™S 330, and Dynapol™ S 1229. Useful saturated, linear amorphous copolyesters available from Creanova, Inc., include Dynapol™ S 1313 and Dynapol™ S 1430.

Further epoxy-containing materials which are particularly useful are glycidyl ether monomers such as glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol) propane). Further examples of epoxides of this type which can be used in the practice of this invention are described in U.S. Pat. No. 3,018,262. Other useful glycidyl ether based epoxy-containing materials are described in U.S. Pat. No. 5,407,978.

There are a number of commercially available epoxy-containing materials which can be used. In particular, epoxides which are readily available include octadecylene oxide, epichlorohydrin, styrene oxide, vinyl cyclohexene oxide, glycidol, glycidylmethacrylate, diglycidyl ether of Bisphenol A (e.g., those available under the trade designations EPON 828, EPON 1004, and EPON 1001F from Shell Chemical Co., and DER-332 and DER-334, from Dow Chemical Co.), diglycidyl ether of Bisphenol F (e.g., ARALDITE GY281 from Ciba-Geigy), epoxy cresol novolac resins (e.g., ARALDITE ECN 1273, ECN 1282 and ECN 1299 from Ciba-Geigy), vinylcyclohexene dioxide (e.g., ERL 4206 from Union Carbide Corp.), 3,4-epoxycyclohexylmethyl-3,4-epoxycyclohexane carboxylate (e.g., ERL-4221 from Union Carbide Corp.), 2-(3,4-epoxycyclohexyl-5,5-spiro-3,4-epoxy) cyclohexane-metadioxane (e.g., ERL-4234 from Union Carbide Corp.), bis(3,4-epoxycyclohexyl) adipate (e.g., ERL-4299 from Union Carbide Corp.), dipentene dioxide (e.g., ERL-4269 from Union Carbide Corp.), epoxidized polybutadiene (e.g., OXIRON 2001 from FMC Corp.), epoxy silanes (e.g., beta-(3,4-epoxycyclohexyl)ethyltrimethoxy silane and gamma-glycidoxypropyltrimethoxy silane, commercially available from Union Carbide), flame retardant epoxy resins (e.g., DER-542, a brominated bisphenol type epoxy resin available from Dow Chemical Co.), 1,4-butanediol diglycidyl ether (e.g., ARALDITE RD-2 from Ciba-Geigy), hydrogenated bisphenol A-epichlorohydrin based epoxy resins (e.g., EPONEX 1510 from Shell Chemical Co.), and polyglycidyl ether of phenolformaldehyde novolak (e.g., DEN-431 and DEN-438 from Dow Chemical Co.).

Bifunctional monomers may also be used and examples that are useful in this invention possess at least one cationically polymerizable functionality or a functionality that copolymerizes with cationically polymerizable monomers, e.g., functionalities that will allow an epoxy-alcohol copolymerization.

The composition of the present invention comprises a two component initiator which includes a salt of an organo-iron complex cation. Suitable salts of organo-iron complex cations of the initiator system include, but are not limited to, those salts disclosed in U.S. Pat. No. 5,089,536, col. 2, line 48, to col. 16, line 10, which application is incorporated herein by reference in its entirety.

In preferred compositions of the invention, the organometallic complex salt of the initiator system is represented by the following formula:

$$[(L^1)_y(L^2)_zFe]^{+q}X_n \qquad (I)$$

wherein
L$^1$ represents one or two of the same or different ligands contributing pi-electrons that are selected from aromatic compounds, and the ligand is capable of contributing six pi-electrons to the valence shell of Fe;

$L^2$ represents none or one of the same or different ligands contributing pi-electrons that are selected from cyclopentadienyl and indenyl anion groups, and the ligand is capable of contributing five pi-electrons to the valence shell of Fe;

q is an integer having a value of 1 or 2, the residual charge of the complex cation;

y is an integer having a value of one or two, z is an integer having a value of zero or one, and the sum of y and z is equal to 2;

X is a halogen-containing complex anion of a metalloid, or tris-(trisfluoromethyl sulfonyl methide); and n is an integer having a value of 1 or 2, the number of complex anions required to neutralize the charge q on the complex cation.

Ligands $L^1$ and $L^2$ are well known in the art of transition metal organometallic compounds.

Illustrative of ligand $L^1$ are substituted and unsubstituted aromatic ligands having up to 25 rings and up to 100 carbon atoms, such as, for example, $eta^6$-benzene, $eta^6$-mesitylene, $eta^6$-toluene, $eta^6$-p-xylene, $eta^6$-o-xylene, $eta^6$-m-xylene, and $eta^6$-cumene. Other aromatic compounds generally recognized within the art are suitable for use with the present invention.

Illustrative of ligand $L^2$ are ligands derived from the substituted and unsubstituted $eta^5$-cyclopentadienyl anion, for example, $eta^5$-cyclopentadienyl anion, $eta^5$-methylcyclopentadienyl anion, $eta^5$-pentamethylcyclopentadienyl anion, and $eta^5$-indenyl anion.

In addition to those described above, suitable anions, X, in Formula I, for use as the counterion in the ionic salts of the organo-iron complex cation in the coating compositions are those in which X can be represented by the formula

$$DQ_r \qquad (II)$$

wherein

D is a metalloid from Groups IIIA to VA of the Periodic Table of Elements (CAS notation), Q is a halogen atom or hydroxyl group, and r is an integer having a value of 1 to 6.

The metalloids preferably are boron, aluminum, antimony, and phosphorus. Preferably, the halogen atom, Q, is chlorine or fluorine. Illustrative of suitable anions are $BF_4^-$, $PF_6^-$, $SbF_5OH^-$ and $SbF_6^-$.

Organo-iron salts are known in the art and can be prepared as disclosed in, for example, EPO Nos. 094,914, 094,915, 126,712, and U.S. Pat. Nos. 5,089,536, 5,059,701, 5,191,101, which are incorporated herein by reference.

In the preferred compositions of the invention, salts of the organo-iron complex cation include those disclosed in U.S. Pat. No. 5,089,536. Examples of the preferred salts of organo-iron complex cations useful in preparing the compositions of the invention include ($eta^6$-xylenes(mixed isomers))($eta^5$-cyclopentadienyl)iron(1+) hexafluoroantimonate and ($eta^6$-m-xylene)($eta^5$-cyclopentadienyl)iron(1+) hexafluoroantimonate, ($eta^6$-cumene)($eta^5$-cyclopentadienyl)iron(1+)hexafluorophosphate, and bis($eta^6$-mesitylene)iron(2+)hexafluoroantimonate.

In the polymerizable compositions of the present invention, the initiator salts can be present in a catalytically effective amount to initiate polymerization, generally in the range of 0.01 to 20 weight percent (wt %), preferably 0.1 to 10 wt %, of the curable composition; i.e., the total compositions excluding any solvent that may be present.

One or more accelerators are included in the composition of the present invention. The accelerators are selected from a class of compounds illustrated by the Formula III. The active portions of these materials (see Formula III) can be part of a polymer or included as part of any component in the compositions of the invention.

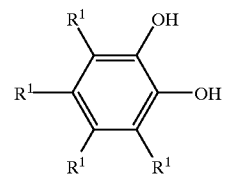

(III)

Molecules of Class 1 comprise dihydroxy aromatics wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted. When the molecule contains more than two aromatic hydroxy groups, at least two of the hydroxy groups must be adjacent to each other, i.e., in an ortho position. It is important that the substituting groups not interfere with the complexing action of the accelerating additive with the metal complex, or interfere with the cationic polymerization of the invention.

Examples of substituting groups that can be present in any $R^1$ group, all of which preferably have less than 30 carbon atoms and up to 10 hetero atoms wherein heteroatoms can interrupt carbon chains to form, for example, ether or thio linkages selected from sulfur or non-peroxidic oxygen, include hydrocarbyl groups such as methyl, ethyl, butyl, dodecyl, tetracosanyl, phenyl, benzyl, allyl, benzylidene, ethenyl, and ethynyl; cyclohydrocarbyl groups such as cyclohexyl; hydrocarbyloxy groups such as methoxy, butoxy, and phenoxy; hydrocarbylmercapto groups such as methylmercapto (thiomethoxy), phenylmercapto (thiophenoxy); hydrocarbyloxycarbonyl such as methoxycarbonyl, propoxycarbonyl, and phenoxycarbonyl; hydrocarbylcarbonyl such as formyl, acetyl, and benzoyl; hydrocarbylcarbonyloxy such as acetoxy, and cyclohexanecarbonyloxy; perfluorohydrocarbyl groups such as trifluoromethyl and pentafluorophenyl; azo; boryl; halo, for example, chloro, iodo, bromo, and fluoro; hydroxy; cyano; nitro; nitroso; trimethylsiloxy; and aromatic groups such as cyclopentadienyl, phenyl, naphthyl and indenyl. Additionally, the $R^1$s may be a unit of a polymer. Examples of this type would be catechol novolak resins, or polystyrene type polymers where the phenyl ring is substituted with at least ortho-dihydroxy groups.

Examples of suitable accelerators are catechol; pyrogallol; gallic acid; esters of gallic acid (prepared from the condensation of the carboxylic acid of gallic acid with alcohols), such as, methyl gallate, ethyl gallate, propyl gallate, butyl gallate; tannins such as tannic acid; alkylcatechols such as 4-tert-butylcatechol, nitrocatechols such as 4-nitrocatechol, methoxycatechol such as 3-methoxycatechol; 2,3,4-trihydroxybenzophenone; and 2,3,4-trihydroxyacetophenone. The accelerators are preferably present in an amount in the range of 0.01 to 10.0 weight percent, and most preferably 0.1 to 4 weight percent of the total polymerizable composition.

In accordance with the present invention, other accelerators may be included with the accelerators of Formula III to adjust the cure rate. The combined use of multiple accelerators can also result in the advantageous color change of the present invention. Examples of other accelerators which may be useful include oxalates, peroxides, and compounds having a β-diketone moiety such as those disclosed in U.S. patent application Ser. No. 09/223,926 filed on Dec. 31, 1998, entitled Accelerators for Energy Polymerizable Compositions (Attorney Docket No. 54459USA9A), herein incorporated by reference in its entirety.

It can also be preferred and within the scope of this invention to add mono- or poly-alcohols as tougheners to the polymerizable composition. The alcohol or polyol aids in chain extension and preventing over-crosslinking of the epoxide during curing.

Representative mono-alcohols can include methanol, ethanol, 1-propanol, 2-propanol, 2-methyl-2-propanol, 1-butanol, 2-butanol, 1-pentanol, neopentyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol, and tetrahydrofurfuryl alcohol.

The polyols useful in the present invention have two to five, preferably two to four, non-phenolic hydroxyl groups. Examples of useful polyols include, but are not limited to, 1,2-ethanediol, 1,2-propanediol, 1,3-propanediol, 1,4-butanediol, 1,3-butanediol, 2-methyl-1,3-propanediol, 2,2-dimethyl-1,3-propanediol, and 2-ethyl-1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, diethylene glycol, triethylene glycol, tetraethylene glycol, glycerine, 2-ethyl-2-(hydroxymethyl)-1,3-propanediol, 2-ethyl-2-methyl-1,3-propanediol, pentaerythritol, 2-ethyl-1,3-pentanediol, and 2,2-oxydiethanol, sorbitol, 1,4-cyclohexane dimethanol, 1,4-benzene dimethanol, 2-butene-1,4-diol, and polyalkoxylated bis-phenol A derivatives. Other examples of useful polyols are disclosed in U.S. Pat. No. 4,503,211.

Higher molecular weight polyols include the polyethylene and polypropylene oxide polymers in the molecular weight range of 200 to 20,000 such as the CARBOWAX polyethyleneoxide materials supplied by Union Carbide, caprolactone polyols in the molecular weight range of 200 to 5,000, such as the TONE polyol materials supplied by Union Carbide, polytetramethylene ether glycol in the molecular weight range of 200 to 4,000, such as the TERATHANE materials supplied by Dupont (Wilmington, Del.), hydroxyl terminated polybutadiene resins such as the POLY BD supplied by Elf Atochem, hydroxyl terminated polyester materials such as the DYNAPOL copolyester materials from Creanova Inc., Somerset, N.J., or equivalent materials supplied by other manufacturers.

The alcohol functional component can be present as a mixture of materials and can contain mono- and poly-hydroxyl containing materials. The alcohol is preferably present in an amount sufficient to provide an epoxy to hydroxy ratio in the composition between about 1:0.1 and 1:1, more preferably between about 1:0.2 and 1:0.8, and most preferably between about 1:0.2 and 1:0.6.

When it is desired to increase the pot-life of compositions of this invention, it can be useful to include a stabilizing additive. Useful pot-life stabilizing additives include Lewis basic, nitrogen-chelate ligands such as 1,10-phenanthroline, 2,2'-dipyridyl, and 2,4,6-tripyridytriazine; trialkyl, triaryl, tricycloalkyl, and trialkaryl amines, phosphines, phosphine oxides, phosphites, arsines, and stibines including triphenylphosphine, triphenylstibine, triphenylarsine, and triphenylphosphite; macrocyclic kryptands and crown ethers such as 12-CROWN-4, 15-CROWN-5, 18-CROWN-6, 21-CROWN-7, KRYPTOFIX 211, and KRYPTOFIX 222, all available from Aldrich Chemical Company, Milwaukee, Wis.; and Schiff base derivatives, which are generally made by the condensation of a ketone or aldehyde with a primary amine. Suitable stabilizing additives are described in U.S. Pat. No. 5,494,943 which is incorporated herein by reference.

An initiation system that includes an organo-iron complex ionic salt described by Formula I, and at least one accelerator described by Formula III, upon application of sufficient energy, will initiate the polymerization of the epoxy-containing monomer of the invention. The level of reactivity depends on various factors such as the choice of ligands and counterions in the organo-iron salt and the selection of the type and amount of the at least one accelerator. For purposes of the present invention, polymerization includes any amount of covalent cross-linking in the polymerizable composition. The energy is preferably in the form of light, or actinic energy. Examples of suitable actinic energy include ultraviolet light, visible light, and electronic beam radiation sources. Optionally, thermal energy may also be applied either with the actinic energy or after application of actinic energy to assist in curing the composition. Examples of thermal energy sources suitable for use with the present invention include induction heating coils, ovens, hot plates, heat guns, infrared sources, lasers, and microwave sources.

Temperature of polymerization and amount of initiator system used will vary depending on the particular polymerizable composition used and the desired application of the polymerized product.

Upon photo-activation, the composition of the present invention exhibits a color change. The degree of change from the initial color is dependent upon the amount of the iron catalyst and accelerator in the composition and the level of actinic energy applied during polymerization. The color change, as indicated by the HunterLab color scale coordinates, is generally indicated by a change in the L value. The change in the L value, often referred to as delta L, is measured by taking the absolute value of the result of the initial color value subtracted from the final color value. Final L values that are lower than the initial L value indicate a darkening of the material. For the present invention, the composition has a change in color reported as a delta L value of about 5 or greater. Preferably, the delta L value is about 15 or greater and most preferably about 20 or greater. The change is viewed as a darkening of the composition, as indicated by measured L values, in the polymerized state, of about 50 or lower. Values of L within the noted range are associated with a color range of gray to black. The amount of accelerator and organo-iron complex cation may be varied to selectively obtain a desired color upon photo-activation.

The ability to adjust the color upon photo-activation enables the advantage of matching the curable composition to other articles. For example, the curable composition can be utilized on motor vehicles with a color match comparable to that of the electrocoat. Using this color matched, B-staged material leads to improved color matching with primer and finished color coats. Additionally, the polymerized, B-staged epoxy composition is electrostatically paintable and capable of maintaining its shape in the relatively high temperatures encountered in an automotive paint-bake cycle (130° C. to 200° C.).

Optionally, silane coupling agents can be utilized in the preparation of cured compositions of the invention. Preferably the silane coupling agent is added to the polymerizable composition to improve adhesion when at least one substrate surface is glass, an oxide, or any other surface that would benefit from the addition of a silane coupling agent. When present, a silane coupling agent contains a functional group that can react with an epoxy resin, e.g., 3-glycidoxypropyltrimethoxylsilane.

Solvents, preferably organic, can be used to assist in dissolution of the initiator system in the polymerizable monomers, and as a processing aid. It may be advantageous to prepare a concentrated solution of the organometallic complex salt in a small amount of solvent to simplify the preparation of the polymerizable composition. Useful solvents are lactones, such as gamma-butyrolactone, and epsilon-caprolactone; ketones such as acetone, methyl ethyl ketone, methyl isobutyl ketone, cyclopentanone and cyclohexanone; sulfones, such as tetramethylene sulfone, 3-methylsulfolane, 2,4-dimethylsulfolane, butadiene sulfone, methyl sulfone, ethyl sulfone, propyl sulfone, butyl sulfone, methyl vinyl sulfone, 2-(methylsulfonyl)ethanol, 2,2'-sulfonyldiethanol; sulfoxides, such as dimethyl sulfoxide; cyclic carbonates such as propylene carbonate, ethylene carbonate and vinylene carbonate; carboxylic acid esters such as ethyl acetate, methyl cellosolve acetate, methyl formate; and other solvents such as methylene chloride, nitromethane, acetonitrile, glycol sulfite and 1,2-dimethoxyethane (glyme). In some applications, it may be advantageous to adsorb the initiator onto an inert support such as silica, alumina, clays, as described in U.S. Pat. No. 4,677,137, which is incorporated herein by reference.

Suitable substrates useful to provide articles of the invention can include, for example, metals (such as aluminum, copper, cadmium, zinc, nickel, steel, iron, silver), glass, paper, wood, various thermoplastic films (such as polyethylene terephthalate, and plasticized polyvinyl chloride), thermoset films (such as polyimide), cloth, ceramics and cellulosics (such as cellulose acetate).

Adjuvants may optionally be added to the compositions such as colorants, abrasive granules, anti-oxidant stabilizers, thermal degradation stabilizers, light stabilizers, conductive particles, tackifiers, flow agents, bodying agents, flatting agents, inert fillers, binders, blowing agents, fungicides, bactericides, surfactants, plasticizers, rubber tougheners and other additives known to those skilled in the art. They also can be substantially unreactive, such as fillers, both inorganic and organic. These adjuvants, if present are added in an amount effective for their intended purpose.

In general, a composition's physical properties, i.e., hardness, stiffness, modulus, elongation, strength, etc., is determined by the choice of the epoxy resin, and if an alcohol containing material is used, the ratio of epoxy to alcohol and the nature of the alcohol. Depending on the particular use, each one of these physical properties of the system will have a particular optimum value. Generally, the cured material from a higher epoxy/alcohol ratio is stiffer than from a lower epoxy/alcohol ratio. Generally, for an epoxy/alcohol composition, a shorter chain polyol yields a cured composition that is stiffer than when using a longer chain polyol. The stiffness of a composition can also be increased by using a shorter chain monofunctional alcohol to replace a polyol. Epoxy/alcohol mixtures generally cure faster than epoxy-only compositions. Cycloaliphatic epoxies cure more rapidly than glycidyl ether epoxies. Mixtures of these two types of epoxies can be used adjust the cure rate to a desired level.

Molded articles produced from the composition of the present invention are made by means known to those skilled in the art, as, for example, by injection molding, extrusion, thermo-forming, casting, etc. In one preferred embodiment, the present inventive composition is utilized in an article adapted for placement over a discontinuity to seal the discontinuity, such as the article disclosed in U.S. patent application Ser. No. 08/911,742, filed on Aug. 15, 1997, herein incorporated by reference. The article used in this manner would include a shaped polymeric cap of a photo-polymerized composition according to the present invention. The cap is placed over a melt-flowable composition that flows and seals the discontinuity over which the article is placed. The article is then heated to a temperature sufficient to cause the melt-flowable composition to flow. The material is then cooled to seal the discontinuity.

The polymeric cap is preferably in a B-staged state prior to application of the article over the discontinuity. The B-staged state results in a semi-rigid cap that resists mass flow. The epoxy composition of the polymeric cap is photo-activated prior to application of the article over the discontinuity. The photo-activation imparts an advantageous color change in the cap that may be used as an indication that the cap is in a state sufficient for application. The cap preferably has a color upon photo-activation in the range of an L value of about 50 to about 30, which corresponds with a gray tone.

FIG. 1 illustrates a paintable article 10 according to the invention. Paintable article 10 is particularly useful for sealing discontinuities such as joints and seams formed in the floors of recessed areas such as, for example, motor vehicle roof ditches. Article 10 comprises a melt-flowable sealant composition 12, and a paintable, melt flow-resistant, shaped polymeric cap 14. The cap is produced from the thermosettable composition of the present invention. Preferably, the cap is made of an epoxy-polyester blend and the two component initiator of the present invention. When the motor vehicle is first painted with a gray colored base coat primer before the article 10 is installed, it can be preferable for the polymerized color of the thermosettable composition to be a shade of gray when cured to form the cap 14.

Another preferred article is a multi-layered tape utilizing the photo-polymerizable composition of the present invention as a sealant composition, such as the article disclosed in U.S. patent application Ser. No. 08/941,430, filed on Sep. 30, 1997, herein incorporated by reference. The article is useful for bonding two substrates together. The article includes a foam core layer having first and second major surfaces, and a thermosettable sealant layer of a photo-polymerizable composition according to the present invention applied onto the first major surface of the core layer. The sealant layer has a surface available for contacting a substrate. The article may also include an optional bonding layer, such as a pressure sensitive adhesive, applied onto a surface of the core layer opposite the sealant layer. Upon photo-activation, the composition of the present invention changes color to indicate a sufficient level of catalyst generation. Upon application of the article between two substrates, the sealant layer is polymerized using heat, to form a bond between the substrates. The color change of the sealant provides an aesthetic advantage by disguising the bond line between the substrates if the color of polymerized sealant is closely matched to the colors of the substrates. Preferably, the polymerized color of the present invention, as indicated by HunterLab color scale coordinates, has an L value of 50 or lower, and most preferably 20 or lower. It is preferred that the cured sealant have a black color tone when the article is used to seal a windshield in place in a motor vehicle.

Figure 2:
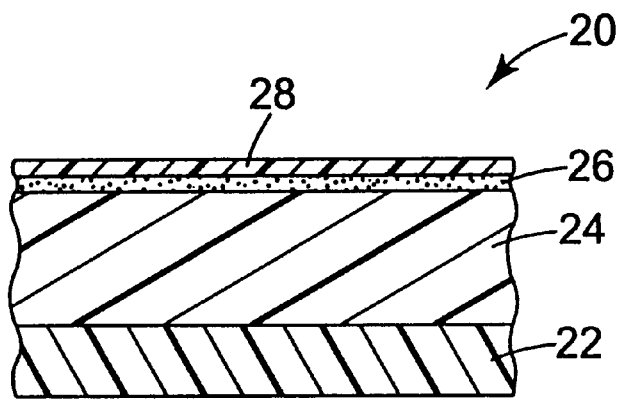
FIG. 2 is an enlarged, segmented, cross-sectional view of a multi-layered article according to the invention.

A multi-layered article in accordance with the present invention is depicted in FIG. 2. FIG. 2 illustrates a multi-layer article 20 in the form of a tape useful for establishing a seal between two substrates. Tape 20 features a sealant layer 22, a core layer 24, an optional bonding layer 26, and an optional, temporary, removable liner 28 for protecting the bonding layer (if present) or the core layer. Liner 28 is removed prior to attaching the bonding layer 26 to a substrate. Alternatively, optional bonding layer 26 may be replaced by an optional, second sealant layer.

Objects and advantages of this invention are further illustrated by the following examples, but they should not be construed as limiting the invention.

In the examples, all parts, ratios, and percents are by weight unless specifically indicated otherwise. All examples were prepared in ambient atmosphere (in the presence of usual amounts of oxygen and water vapor) unless indicated otherwise

EXAMPLES 1–9 AND COMPARATIVE EXAMPLES C1–C9

Materials Used to Prepare the Examples.
Dynapol S 330 (also known as X 1158) available from Creanova, Inc., Somerset, N.J., USA.
Araldite ECN-1299 epoxy resin available from Ciba-Geigy Corporation, Tarrytown, N.Y., USA.
CpFe(Xylenes)$^+$SbF$_6{}^-$ (also known as (eta$^6$-xylenes)(eta$^5$-cyclopentadienyl) iron (1+) hexafluoroantimonate) made by 3M Company, St. Paul, Minn., USA.
Propyl gallate (also known as Tenox PG) available from Eastman Chemical Corporation, Kingsport, Tenn., USA.
Caprolactone (also known as epsilon-caprolactone) available from Aldrich Chemical Co., Milwaukee, Wis., USA.
Example Preparation Approximately, 70 g polyester resin, marketed as Dynapol S 330 (also known as X 1158) and 30 g Araldite ECN-1299 epoxy resin were weighed into ointment tins according to Table 1. Each of the containers were heated in a 177° C. oven until the polyester and epoxy were melted. The containers were then removed from the oven and allowed to cool at room temperature. Concurrently, a 25 wt. % solution was made of the iron catalyst in caprolactone solvent. The tins were placed in the oven and allowed to reach temperature (30 minutes). When melted, each Example was removed from the oven, the accelerator was added in the amount indicated in Table 1, and mixed in by hand using a doctor blade. The example was then returned to the oven. The catalyst was then added and mixed in by hand using a doctor blade. The Example was immediately coated on a knife coater, heated to approximately 100° C. and prepared with release coated polyester film, top and bottom. Final thickness of each Example averaged 1 mm. The Examples were stored in the dark until needed.
Light Exposure Procedure Strips were cut from each Example, and placed under a light source consisting of eight fluorescent Philips TL 140/03 bulbs. The light intensity was measured with a Radiometer/Photometer, model No. IL 1400A available from International Light, Inc. Newburyport, Mass., USA, and averaged 0.12 J/cm2 per minute. The Examples were exposed on both sides for 20 minutes each.
Procedure to Evaluate Color Sections, having dimensions of approximately 5 cm by 5 cm, were cut from each Example. The Examples were then placed in the sampling area of a calibrated Hunter-Douglas PC2D calorimeter. An initial reading was taken for each Example and the color values L, a and b were recorded.

The Color L value is a HunterLab scale of lightness and darkness in color in which high numbers, i.e., closer to 100, are white, and low numbers, i.e., close to 0 are black. The test is performed according to manufacturer's instructions on PC2D colorimeter available from HunterLab Associates, Reston, Va., USA. The instrument is calibrated with a white tile having an L value of 92, and a black tile having an L value close to 0. A gray tile having an L value of 30.9 is checked for comparison.

Each Example was then exposed to light for 20 minutes on each side as described above. The Examples were then placed in the colorimeter and the values of L, a, and b were recorded. A delta L was calculated by taking the absolute value of the difference between the final value and the initial value. The initial L, a, and b readings, final L, a, and b readings after light exposure, and the Delta L values are reported in Table 2. Table 2 indicates that examples of the present invention exhibit a significant color change, reported as Delta L, over the Comparative Examples. Each of the Comparative Examples exhibited a Delta L upon photo-activation of less than 4.7. Each of the examples of the present invention, upon photo-activation, resulted in a color change of at least 13 points.

TABLE 1

Formulations (in grams)

| Example # | Dynapol X1158 | ECN-1299 | Mixed-Iron Catalyst In Caprolactone (25 wt. %) | Propyl Gallate | Tertiary Butyl Oxalate Ester | Perkadox BC |
|---|---|---|---|---|---|---|
| C1 | 70 | 30 | 0.01 | | | |
| C2 | 70 | 30 | 0.03 | | | |
| C3 | 70 | 30 | 0.05 | | | |
| C4 | 70 | 30 | 0.05 | | 0.01 | |
| C5 | 70 | 30 | 0.05 | | 0.03 | |
| C6 | 70 | 30 | 0.05 | | 0.05 | |
| C7 | 70 | 30 | 0.05 | | | 0.01 |
| C8 | 70 | 30 | 0.05 | | | 0.03 |
| C9 | 70 | 30 | 0.05 | | | 0.05 |
| 1 | 70 | 30 | 0.01 | 0.01 | | |
| 2 | 70 | 30 | 0.03 | 0.01 | | |
| 3 | 70 | 30 | 0.05 | 0.01 | | |
| 4 | 70 | 30 | 0.01 | 0.03 | | |
| 5 | 70 | 30 | 0.03 | 0.03 | | |

TABLE 1-continued

Formulations (in grams)

| Example # | Dynapol X1158 | ECN-1299 | Mixed-Iron Catalyst In Caprolactone (25 wt. %) | Propyl Gallate | Tertiary Butyl Oxalate Ester | Perkadox BC |
|---|---|---|---|---|---|---|
| 6 | 70 | 30 | 0.05 | 0.03 | | |
| 7 | 70 | 30 | 0.01 | 0.05 | | |
| 8 | 70 | 30 | 0.03 | 0.05 | | |
| 9 | 70 | 30 | 0.05 | 0.05 | | |

TABLE 2

Actual color measurements

| | Initial Readings | | | Readings after Light Exposure | | | |
|---|---|---|---|---|---|---|---|
| Example | L | a | b | L | a | b | Delta L |
| C1 | 72.8 | −3.5 | 7.4 | 72.8 | −3.1 | 5.6 | 0.0 |
| C2 | 73.4 | −3.6 | 8.8 | 72.8 | −3.2 | 7.1 | 0.6 |
| C3 | 73.9 | −39 | 8.8 | 71 | −3.8 | 8.4 | 2.9 |
| C4 | 71.6 | −3.9 | 11.2 | 66.9 | −4.8 | 9.5 | 4.7 |
| C5 | 70.1 | −4.0 | 11.7 | 66.8 | −5.1 | 9.9 | 3.3 |
| C6 | 69.8 | −3.6 | 11.8 | 66.8 | −5.1 | 9.6 | 3.0 |
| C7 | 71.2 | −4.3 | 10.7 | 67.2 | −4.6 | 9.4 | 4.0 |
| C8 | 69.4 | −3.8 | 11.3 | 67.0 | −4.4 | 8.8 | 2.4 |
| C9 | 70.5 | −3.8 | 10.8 | 65.8 | −4.6 | 9.4 | 4.7 |
| 1 | 69.6 | −4.4 | 14.8 | 55.5 | −1.7 | 2.6 | 14.1 |
| 2 | 71.1 | −4.2 | 14.7 | 57.5 | −2.1 | 3.4 | 13.6 |
| 3 | 71.6 | −4.2 | 14.9 | 57.8 | −1.8 | 3.3 | 13.8 |
| 4 | 71.6 | −3.8 | 17.7 | 50.4 | −1.1 | −0.1 | 21.2 |
| 5 | 71.7 | −3.9 | 17.6 | 49.2 | −1.8 | −0.3 | 22.5 |
| 6 | 67.9 | −3.7 | 18.2 | 47.2 | −1.7 | 0.7 | 20.7 |
| 7 | 71.3 | −3.4 | 18.8 | 47.2 | −1.6 | 0.1 | 24.1 |
| 8 | 69.9 | −3.3 | 18.8 | 47.2 | −1.5 | 0.5 | 22.7 |
| 9 | 67.8 | −3.2 | 19.1 | 45 | −1.3 | 0.2 | 22.8 |

EXAMPLES 10–11 AND COMPARATIVE EXAMPLE C10

Procedure to Evaluate Gel Time

The examples were produced in a similar manner utilizing the materials noted in the previous Examples. The formulations for each of the Examples are reported in Table 3. Examples were then exposed to the same light source used in the previous Examples for a period of 5 minutes on each side. Following this, pieces having dimensions of approximately 12 mm×12 mm were cut from the exposed Example and placed on a metal pan covered with release coated polyester film. The oven was set at 177° C. The pan with the Examples was placed in the oven for a predetermined time, for Example 1 minute. After this time, the pan was removed and the Examples were tested immediately for cure while hot by scraping each with the end of a wooden applicator stick. The Example was gelled if the material had formed a cohesive film and could not be smeared out. The Example was not gelled if the material was still essentially liquid and could be smeared out with the stick. This procedure was done at increasing times to determine the gel time for each Example. The resulting gel times are reported in Table 3. The gel times for the Examples of the present invention were shorter than Comparative Example 10.

Differential Photo-calorimetry (DPC)

Differential Photo-calorimetry was used to irradiate the Examples prior to Differential Scanning Calorimetry (DSC). DPC example sizes were 6 to 12 mg. Light exposure was done in open aluminum pans, under nitrogen purge, in a TA Instruments Inc. 912 DSC base, equipped with a TA Instruments Inc. 930 differential photocalorimeter (TA Instruments Inc., New Castle, Del.). A 200 watt mercury lamp was used for the photolysis step. In these experiments, the Example was held isothermally at 50° C. throughout the entire DPC experiment. The Example was kept dark for 2 minutes, then a shutter was opened to allow the Example to be irradiated for 5 minutes after which the shutter was closed and the Example was kept dark for an additional 2 minutes. Immediately following DPC, the Examples were capped and heated at 10° C./minute in a DSC experiment as described below.

Differential Scanning Calorimetry (DSC)

Differential Scanning Calorimetry (DSC) was performed on a TA Instruments Inc. (New Castle, Del.) 912 DSC, and used to measure the exothermic heat of reaction associated with the thermal cure of the cationically polymerizable monomer. Testing was done in sealed, aluminum, liquid example pans, at a rate of 10° C./min from room temperature (23° C.) to 300° C. The data from the reaction process was graphed on a chart showing heat flow vs. temperature. The integrated area under an exothermic peak represents the total exotherm energy produced during the reaction and is measured in Joules/gram (J/g); the exotherm energy is proportional to extent of cure, i.e., degree of polymerization. The exotherm profile, i.e., onset temperature (the temperature at which reaction will begin to occur), peak temperature, and end temperature, provides information on conditions needed to cure the material. It is generally understood by those skilled in the art that for any particular reaction, a shift toward lower onset and/or peak temperature for the exotherm indicates that the reactant material is polymerizing at the lower temperatures, which correlates with shorter gel time. The DSC results are reported in Table 4. The table indicates that both Examples 10 and 11 have shorter gel times over Comparative Example 10.

TABLE 3

Formulations (in grams) and Gel Measurements.

| | C10 | 11 | 12 |
|---|---|---|---|
| Dynapol S 330 | 70 | 70 | 70 |
| Araldite ECN 1299 | 30 | 30 | 30 |
| Iron catalyst | 1 | 1 | 1 |
| Propyl gallate | — | 0.20 | — |
| 2,3,4-trihydroxy benzophenone | — | — | 0.20 |
| Time to gel at 177° C. | 1 min. 55 sec. | 1 min. 15 sec. | 1 min. 15 sec. |

TABLE 4

Differential Scanning Calorimetry Results.

| Example # | C10 | 11 | 12 |
|---|---|---|---|
| Onset Temp (° C.) | 108.6 | 83.0 | 101.8 |
| Peak Temp (° C.) | 160.0 | 137.6 | 143.9 |
| Exotherm (J/g) | 156.8 | 181.0 | 155.6 |

From the above disclosure of the general principles of the present invention and the preceding detailed description, those skilled in this art will readily comprehend the various modifications to which the present invention is susceptible. Therefore, the scope of the invention should be limited only by the following claims and equivalents thereof.

What is claimed is:

1. A photo-polymerizable composition comprising,
    a) at least one photo-polymerizable epoxy-containing monomer, and
    b) a two-component initiator comprising
        (1) at least one salt of an organo-iron complex cation, and
        (2) at least one accelerator represented by the formula

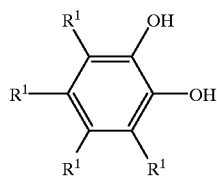

wherein each $R^1$, independently, can be hydrogen or a radical moiety selected from substituted and unsubstituted alkyl, alkenyl, alkynyl, and alkoxy groups containing from 1 to 30 carbon atoms, or groups of one to four substituted or unsubstituted aromatic rings wherein two to four rings can be fused or unfused, or two $R^1$s taken together can form at least one ring which is saturated or unsaturated and the ring can be substituted or unsubstituted and wherein when the molecule contains more than two aromatic hydroxy groups, at least two of the hydroxy groups must be adjacent to each other.

2. The composition as recited in claim 1, wherein said composition upon application of actinic energy exhibits a color change.

3. The composition as recited in claim 2, wherein said color change, according to HunterLab color scale coordinates, is indicated by a change in an L value of about 5 or greater.

4. The composition as recited in claim 3, wherein said color change is measured upon exposure to visible light at an intensity of 0.12 J/cm² per minute for about 20 minutes.

5. The composition as recited in claim 1, wherein the composition, upon photo-acitivation, exhibits a color, in accordance with HunterLab color scale coordinates, having an L value of about 50 or lower.

6. The composition as recited in claim 1, further comprising at least one mono or poly alcohol toughener.

7. The composition as recited in claim 6, wherein said toughener is a polyester polyol.

8. The composition as recited in claim 1 wherein said salt of an organo-iron complex cation has the formula $$[(L^1)_y(L^2)_z Fe]^{+q} X_n \qquad (I)$$

wherein $L^1$ represents one or two of the same or different ligands contributing pi-electrons that are selected from aromatic compounds, and the ligand is capable of contributing six pi-electrons to the valence shell of Fe;

$L^2$ represents none or one of the same or different ligands contributing pi-electrons that are selected from cyclopentadienyl and indenyl anion groups, and the ligand is capable of contributing five pi-electrons to the valence shell of Fe;

q is an integer having a value of 1 or 2, the residual charge of the complex cation;

y is an integer having a value of one or two, z is an integer having a value of zero or one, and the sum of y and z is equal to 2;

X is a halogen-containing complex anion of a metalloid or tris-(trifluoromethyl sulfonyl methide); and n is an integer having a value of 1 or 2, the number of complex anions required to neutralize the charge q on the complex cation.

9. The composition as recited in claim 8, wherein said salt is selected from (eta⁶-m-xylene)(eta⁵-cyclopentadienyl)iron (+1) hexafluoroantimonate and from (eta⁶-xylene(mixed isomers))(eta⁵-cyclopentadienyl)iron (+1) hexafluoroantimonate.

10. The composition as recited in claim 1, wherein said accelerator comprises at least one of propyl gallate and 2,3,4-trihydroxybenzophenone.

11. The composition according to claim 1 in a photo-polymerized state.

12. A process comprising the steps:
    a) providing the photo-polymerizable composition according to claim 1, and
    b) adding sufficient actinic energy to the composition to photo-polymerize said composition.

* * * * *

UNITED STATES PATENT AND TRADEMARK OFFICE
CERTIFICATE OF CORRECTION

PATENT NO. : 6,133,335
DATED : October 17, 2000
INVENTOR(S) : Wayne S. Mahoney et al.

It is certified that error appears in the above-identified patent and that said Letters Patent is hereby corrected as shown below:

Column 14,
Line 22, "calorimeter" should read -- colorimeter --.

Signed and Sealed this

Twentieth Day of November, 2001

Attest:

*Nicholas P. Godici*

NICHOLAS P. GODICI
*Attesting Officer*      *Acting Director of the United States Patent and Trademark Office*